United States Patent
Shih et al.

(10) Patent No.: US 11,612,078 B2
(45) Date of Patent: Mar. 21, 2023

(54) HEAT DISSIPATION CASE

(71) Applicant: Fulian Precision Electronics (Tianjin) Co., LTD., Tianjin (CN)

(72) Inventors: Tung-Ho Shih, New Taipei (TW); Yao-Chih Liu, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 258 days.

(21) Appl. No.: 17/038,219

(22) Filed: Sep. 30, 2020

(65) Prior Publication Data

US 2022/0071062 A1 Mar. 3, 2022

(30) Foreign Application Priority Data

Sep. 1, 2020 (CN) .......................... 202010905321.1

(51) Int. Cl.
*H05K 7/20* (2006.01)

(52) U.S. Cl.
CPC ..... *H05K 7/20618* (2013.01); *H05K 7/20563* (2013.01)

(58) Field of Classification Search
CPC .......... H05K 7/20618; H05K 7/20563; H05K 7/20181; G06F 1/183; G06F 1/20
See application file for complete search history.

(56) References Cited

U.S. PATENT DOCUMENTS

| 6,316,718 B1 * | 11/2001 | Lin ..................... H05K 7/20172 174/17 VA |
| 10,372,178 B2 * | 8/2019 | Chang ................ H05K 7/20727 |

* cited by examiner

*Primary Examiner* — Lionel Nouketcha
(74) *Attorney, Agent, or Firm* — ScienBiziP, P.C.

(57) ABSTRACT

A heat dissipation case includes a case body, a carrying frame configured to be slidably mounted on the case body, a shutter rotationally mounted on the case body, and a number of levers rotationally mounted on the case body. One end of the levers resists against the shutter. The carrying frame is configured to resist against the other end of the levers, so that the end of the levers resisting against the shutter drives the shutter to rotate and open toward the carrying frame.

18 Claims, 4 Drawing Sheets

HEAT DISSIPATION CASE

FIELD

The subject matter herein generally relates to a heat dissipation case.

BACKGROUND

Computers and other electronic devices generally need to be equipped with fans for heat dissipation, and a shutter is installed to control a heat dissipation area. At present, when an insert such as a hard disk is inserted, one side of the hard disk contacts the shutter to rotate the shutter. However, the shutter may be rotated by the operation of the fan, which may damage the shutter. Furthermore, the insert directly contacting the shutter may damage the shutter.

BRIEF DESCRIPTION OF THE DRAWINGS

Implementations of the present disclosure will now be described, by way of embodiments, with reference to the attached figures.

DETAILED DESCRIPTION

Figure 1:
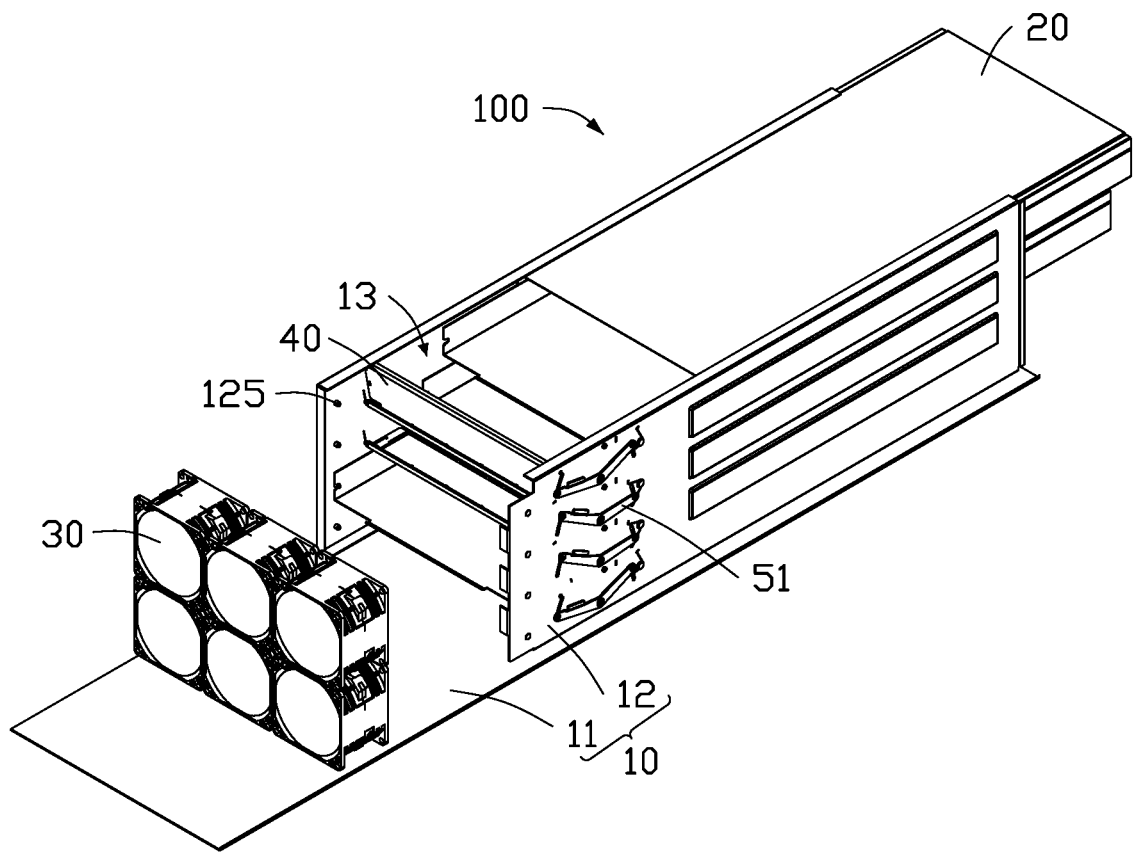
FIG. 1 is a schematic perspective diagram of a heat dissipation case according to an embodiment of the present application.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

The term "comprising" means "including, but not necessarily limited to"; it specifically indicates open-ended inclusion or membership in a so-described combination, group, series, and the like.

FIG. 1 shows an embodiment of a heat dissipation case 100. The heat dissipation case 100 may be a computer case, a server case, or a case of another heat dissipation device. The heat dissipation case 100 includes a case body 10, a carrying frame 20, a plurality of shutters 40, and a plurality of levers 51. The carrying frame 20 is slidably arranged on the case body 10. The carrying frame 20 is used to carry functional units and may be a receiving unit for installing hard disks, motherboards, electronic components, or the like. A fan 30 is provided in the heat dissipation case 100. The fan 30 is arranged on the case body 10. The fan 30 can suck air flowing from a side of the carrying frame 20 and discharge the air to the outside of the heat dissipation case 100. Each shutter 40 is rotationally mounted on the case body 10 and located between the carrying frame 20 and the fan 30. The lever 51 is rotationally mounted on the case body 10, and one end of the lever 51 abuts against a side of the shutter 40 adjacent to the fan 30. When the carrying frame 20 is not installed on the case body 10, the shutter 40 is in a closed state. When the carrying frame 20 slides into the case body 10, the carrying frame 20 resists the other end of the lever 51 to drive the lever 51 to rotate, thereby driving the shutter 40 to rotate and open in a direction opposite to the air flow direction in the case body 10, so that the carrying frame 20 can pass through the shutter 40 to be mounted on the case body 10. In another embodiment, the carrying frame 20 does not pass through the shutter 40.

Specifically, the case body 10 includes a bottom wall 11 and two side walls 12. The two side walls 12 and the bottom wall 11 jointly enclose a receiving space 13 for receiving the carrying frame 20. The carrying frame 20 is inserted into the receiving space 13 from one end of the receiving space 13. The fan 30 is provided at the other end of the receiving space 13. The shutters 40 are rotationally mounted between the two side walls 12 to separate the fan 30 from the carrying frame 20. The lever 51 is rotationally arranged on the side walls 12.

Figure 2:
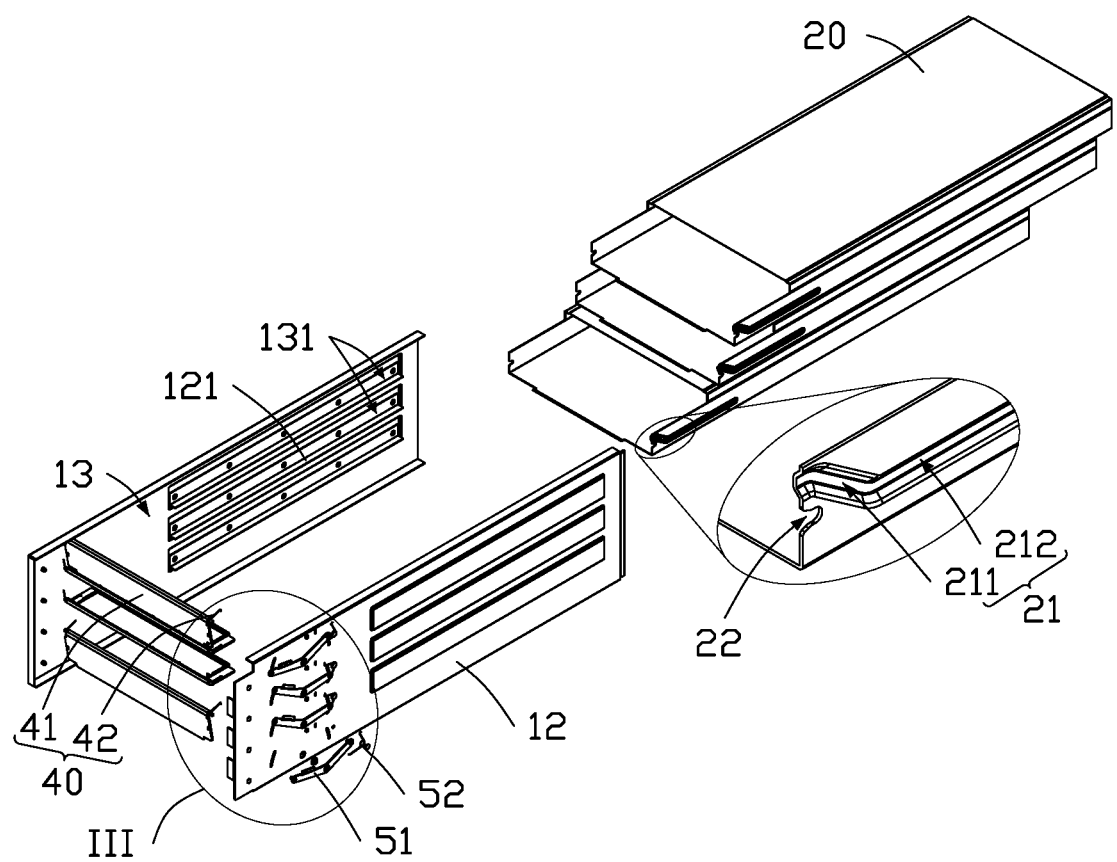
FIG. 2 is a partially exploded perspective view of the heat dissipation case of FIG. 1.

Referring to FIG. 2, a plurality of partitions 121 is provided on each side wall 12. The partition 121 extends along a length of the side wall 12. The plurality of partitions 121 is evenly distributed on the side wall 12 to divide the receiving space 13 into a plurality of receiving cavities 131. In one embodiment, there is a plurality of carrying frames 20, and each carrying frame 20 is received in a corresponding receiving cavity 131.

Figure 3:
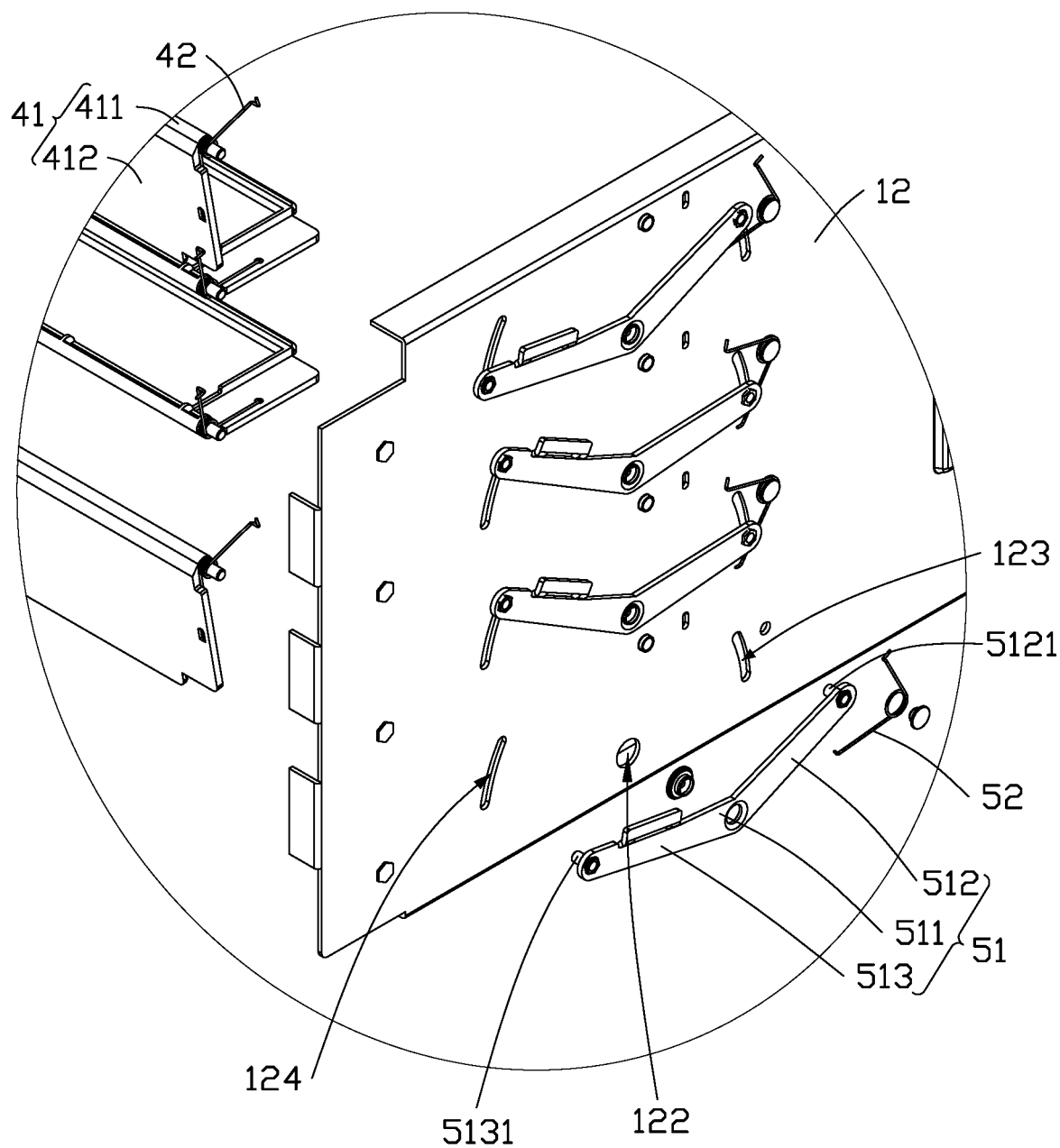
FIG. 3 is an enlarged view of circled portion III in FIG. 2.

Referring to FIG. 3, each shutter 40 includes a blade 41 and a restoring member 42. Each blade 41 is rotationally mounted in the corresponding receiving cavity 131. The blade 41 includes a shaft portion 411 and a plate portion 412. Two ends of the shaft portion 411 are respectively rotationally mounted on the two side wall 12. The plate portion 412 extends axially outward from the shaft portion 411 and can close or open the receiving cavity 131 as the shaft portion 411 rotates. The restoring member 42 is provided on the blade 41 and is used to keep the blade 41 in a closed state.

In one embodiment, the restoring member 42 is a torsion spring. The restoring member 42 is sleeved on an end of the shaft portion 411, such that one end of the restoring member 42 is set on the side wall 12, and the other end of the restoring member 42 abuts on the plate portion 412.

In one embodiment, the restoring member 42 may not be provided, and the blade 41 restores by gravity.

In one embodiment, a side of the plate portion 412 of the blade 41 away from the shaft portion 411 abuts against the shaft portion 411 of an adjacent blade 41 in the closed state, so that the plurality of blades 41 separates the receiving space 13 together when in the closed state.

Each lever 51 includes a return member 52. The levers 51 are rotationally arranged on the side walls 12 and cooperate with a corresponding blade 41. The lever 51 includes a rotating portion 511, a guiding portion 512, and a resisting portion 513. The rotating portion 511 is rotationally mounted on the corresponding side wall 12. Each of the guiding portion 512 and the resisting portion 513 extends away from the rotating portion 511. An end of the resisting portion 513 away from the rotating portion 511 resists the plate portion 412 of the corresponding blade 41. An end of the guiding portion 512 away from the rotating portion 511 extends into the receiving cavity 131 to resist against the carrying frame 20 when the carrying frame 20 is inserted into the receiving cavity 131, thereby driving the lever 51 to rotate. The return member 52 is provided on the side wall 12 to make the lever 51 in a state to contact the carrying frame 20.

In one embodiment, the lever 51 is substantially V-shaped, and the rotating portion 511 is a joint of the guiding portion 512 and the resisting portion 513. In other embodiments, the lever 51 may be linear, arc-shaped, or other irregular shapes, as long as it can meet the requirements of the guiding portion 512 to cooperate with the carrying frame 20, and the resisting portion 513 to cooperate with the plate portion 412.

In one embodiment, the return member 52 is a torsion spring. The return member 52 is fixed on the side wall 12. One end of the return member 52 is disposed on the side wall 12, and the other end of the return member 52 resists on the guiding portion 512.

In another embodiment, the return member 52 may be omitted, and the lever 51 may be designed as a structure that resets by gravity, or the lever 51 may be driven by the weight of the blade 41 to reset.

Specifically, a guiding groove 21 is defined in surfaces of the carrying frame 20 adjacent to the lever 51. The guiding groove 21 includes a rotating groove 211 and a holding groove 212 in communication with each other. An extending direction of the holding groove 212 is parallel to an insertion direction of the carrying frame 20. A guiding block 5121 is provided at an end of the guiding portion 512 away from the rotating portion 511. When the carrying frame 20 is inserted, the guiding block 5121 enters the rotation groove 211 and drives the lever 51 to rotate, so that the resisting portion 513 resists the plate portion 412 to rotate and open the blade 41. After the blade 41 is completely rotated and opened, the guiding block 5121 enters the holding groove 212 from the rotating groove 211 to maintain a position of the lever 51, thereby keeping the blade 41 in an open state to facilitate the continuous insertion of the carrying frame 20.

In one embodiment, the side wall 12 defines a rotation hole 122, a guiding slot 123, and a holding slot 124. The guiding slot 123 and the holding slot 124 are respectively arc-shaped slots centered on the rotation hole 122. The lever 51 and the return member 52 are located on a side of the side wall 12 facing away from the other side wall 12. The rotating portion 511 is rotationally received in the rotation hole 122. The guiding block 5121 extends from the rotating portion 511 through the guiding slot 123 into the receiving cavity 131. An end of the resisting portion 513 away from the rotating portion 511 is provided with a resisting block 5131. The resisting block 5131 extends through the holding slot 124 to resist the plate portion 412 of the blade 41.

In one embodiment, the levers 51 are provided on one of the side walls 12, but in other embodiments, the levers 51 are provided on both of the side walls 12.

In one embodiment, a limiting member 125 is provided on the side wall 12. The limiting member 125 is arranged between the fan 30 and the shutter 40. The limiting member 125 is used to limit a moving distance of the carrying frame 20 to prevent the carrying frame 20 from colliding with the fan 30 when the carrying frame 20 is inserted. A limiting slot 22 may be defined at an end of the carrying frame 20 facing the fan 30. The limiting slot 22 is used for receiving the limiting member 125 to fix the carrying frame 20.

Figure 4:
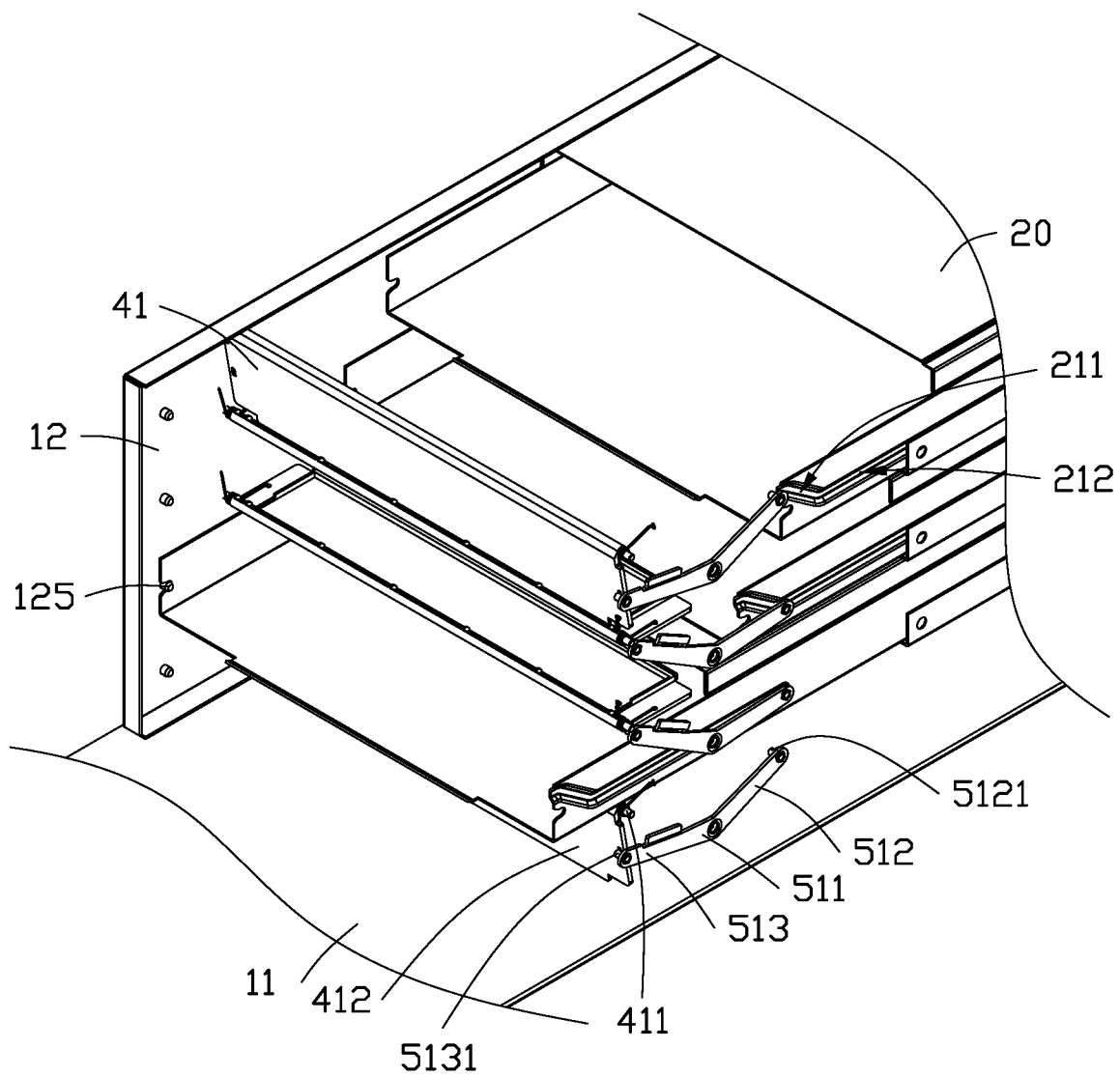
FIG. 4 is a partial perspective view of the heat dissipation case shown in FIG. 1 with side walls and a fan removed.

Referring to FIG. 4, when the carrying frame 20 is not inserted, the blade 41 is in a closed state under the action of the restoring member 42. When the carrying frame 20 is inserted, the carrying frame 20 moves toward the fan 30, so that the guiding groove 21 is adjacent to the guiding block 5121 passing through the guiding slot 123. After the guiding groove 21 accommodates the guiding block 5121, the carrying frame 20 continues to move in the direction of the fan 30, so that the guiding block 5121 rotates along the guiding slot 123 under the action of a side wall of the rotating groove 211 to drive the lever 51 to rotate, so that the resisting block 5131 rotates along the holding slot 124 to resist against the plate portion 412 of the blade 41, thereby driving the blade 41 to rotate and open. When the blade 41 is fully opened, the guiding block 5121 enters the holding groove 212 from the rotating groove 211 under the action of the side wall of the holding groove 212, so that the position of the lever 51 is maintained, and the blade 41 is maintained in the open state, so that the carrying frame 20 can continue to be inserted. When the limiting slot 22 fully receives the limiting member 125, the carrying frame 20 cannot be inserted further. When the carrying frame 20 needs to be taken out, the carrying frame 20 is directly drawn out, so that the lever 51 rotates in the opposite direction, and the restoring member 42 and the return member 52 respectively act on the blade 41 and the guiding portion 512, thereby resetting the blade 41 and the lever 51.

The fan 30 and the heat dissipation case 100 may be applied in a heat dissipation device, and the fan 30 is installed in the heat dissipation case 100.

The heat dissipation device may be an electronic device or a device that requires heat dissipation, such as an air-drying cabinet.

The carrying frame 20 does not directly contact the shutter 40, thereby extending a service life of the shutter 40, and the heat dissipation case 100 is improved.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A heat dissipation case comprising:
   a case body;
   a carrying frame configured to be slidably mounted on the case body;
   a plurality of shutters rotationally mounted on the case body; and
   a plurality of levers rotationally mounted on the case body, one end of each lever of the plurality of levers resisting against a corresponding shutter of the plurality of shutters; wherein:
   the carrying frame is configured to resist against the other end of each lever, so that the end of each lever resisting against the corresponding shutter drives the corresponding shutter to rotate and open toward the carrying frame.

2. The heat dissipation case of claim 1, wherein:
   the case body comprises a bottom wall and two side walls;
   the two side walls and the bottom wall jointly enclose a receiving space for receiving the carrying frame;
   the carrying frame is inserted into the receiving space from one end of the receiving space;
   each of the plurality of shutters is rotationally mounted between the two side walls; and
   the plurality of levers are rotationally mounted on at least one of the side walls.

3. The heat dissipation case of claim 2, wherein:
each of the plurality of shutters comprises a blade rotationally arranged in the receiving space;
the blade comprises a shaft portion and a plate portion;
two ends of the shaft portion are respectively rotationally mounted on the two side walls; and
the plate portion extends axially outward from the shaft portion and is configured to close or open the receiving space by rotation of the shaft portion.

4. The heat dissipation case of claim 3, wherein:
the shutter further comprises a restoring member; and
the restoring member is provided on the blade for maintaining the blade in a closed state.

5. The heat dissipation case of claim 4, wherein:
the restoring member is a torsion spring sleeved on an end of the shaft portion; and
one end of the restoring member is set on the side wall, and the other end of the restoring member resists against the plate portion.

6. The heat dissipation case of claim 3, wherein:
a side of the plate portion of the blade away from the shaft portion abuts against the shaft portion of an adjacent blade when in the closed state.

7. The heat dissipation case of claim 3, wherein:
each of the plurality of levers comprises a rotating portion, a guiding portion, and a resisting portion;
the rotating portion is rotationally mounted on the side wall;
the guiding portion and the resisting portion respectively extend from the rotating portion;
an end of the resisting portion away from the rotating portion resists against the plate portion of the blade, and an end of the guiding portion away from the rotating portion extends into the receiving space to resist against the carrier frame when the carrier frame is inserted, thereby driving the plurality of levers to rotate.

8. The heat dissipation case of claim 7, wherein:
the carrying frame defines a guiding groove comprising a rotating groove and a holding groove in communication with each other;
an end of the guiding portion away from the rotating portion is provided with a guiding block;
the guiding block is configured to be received in the rotation groove to drive the plurality of levers to rotate;
an extension direction of the holding groove is parallel to an insertion direction of the carrying frame; and
the guiding block is configured to be received in the holding groove to maintain a position of the lever.

9. The heat dissipation case of claim 8, wherein:
at least one of the side walls defines a rotation hole, a guiding slot, and a holding slot;
the plurality of levers are provided on a side of the side wall facing away from the other side wall;
the rotating portion is rotationally mounted in the rotation hole;
the guiding block extends from the rotating portion through the guiding slot into the receiving space;
an end of the resisting portion away from the rotating portion is provided with a resisting block; and
the resisting block extends through the holding slot and resists against the plate portion of the blade.

10. A heat dissipation case comprising:
a case body;
a plurality of carrying frames configured to be slidably mounted on the case body;
a plurality of shutters rotationally mounted on the case body; and
a plurality of levers rotationally mounted on the case body, one end of each lever of the plurality of lever resisting against a corresponding shutter of the plurality of shutters, and another end of each lever resisting against a corresponding one of the plurality of carrying frames; wherein:
a number of the plurality of levers is equal to a number of the plurality of carrying frames and a number of the plurality of shutters, and the plurality of levers correspond to the plurality of carrying frames and the plurality of shutters in a one-to-one relationship;
the end of each lever of the plurality of levers resisting against the corresponding shutter is configured to drive the corresponding shutter to rotate and open toward the corresponding one of the plurality of carrying frames; and
the corresponding one of the plurality of carrying frames does not contact the corresponding shutter directly.

11. The heat dissipation case of claim 10, wherein:
the case body comprises a bottom wall and two side walls;
the two side walls and the bottom wall jointly enclose a receiving space for receiving the plurality of carrying frames;
each carrying frame is inserted into the receiving space from one end of the receiving space;
the plurality of shutters are rotationally mounted between the two side walls; and
the plurality of levers are rotationally mounted on at least one of the side walls.

12. The heat dissipation case of claim 11, wherein:
each of the plurality of shutters comprises a blade rotationally arranged in the receiving space;
the blade comprises a shaft portion and a plate portion;
two ends of the shaft portion are respectively rotationally mounted on the two side walls; and
the plate portion extends axially outward from the shaft portion and is configured to close or open the receiving space by rotation of the shaft portion.

13. The heat dissipation case of claim 12, wherein:
each shutter further comprises a restoring member; and
the restoring member is provided on the blade for maintaining the blade in a closed state.

14. The heat dissipation case of claim 13, wherein:
the restoring member is a torsion spring sleeved on an end of the shaft portion; and
one end of the restoring member is set on the corresponding side wall, and the other end of the restoring member resists against the plate portion.

15. The heat dissipation case of claim 14, wherein:
a side of the plate portion of the blade away from the shaft portion abuts against the shaft portion of an adjacent blade when in the closed state.

16. The heat dissipation case of claim 15, wherein:
each of the plurality of levers comprises a rotating portion, a guiding portion, and a resisting portion;
the rotating portion is rotationally mounted on the corresponding side wall;
the guiding portion and the resisting portion respectively extend from the rotating portion;
an end of the resisting portion away from the rotating portion resists against the plate portion of the corresponding blade, and an end of the guiding portion away from the rotating portion extends into the receiving space to resist against the corresponding carrier frame when the carrier frame is inserted, thereby driving the plurality of levers to rotate.

17. The heat dissipation case of claim 16, wherein:
- each of the plurality of carrying frames defines a guiding groove comprising a rotating groove and a holding groove in communication with each other;
- an end of the guiding portion away from the rotating portion is provided with a guiding block;
- the guiding block is configured to be received in the rotation groove to drive the plurality of levers to rotate;
- an extension direction of the holding groove is parallel to an insertion direction of the carrying frame; and
- the guiding block is configured to be received in the holding groove to maintain a position of the plurality of levers.

18. The heat dissipation case of claim 17, wherein:
- at least one of the side walls defines a rotation hole, a guiding slot, and a holding slot;
- the plurality of levers are provided on a side of the side wall facing away from the other side wall;
- the rotating portion is rotationally mounted in the rotation hole;
- the guiding block extends from the rotating portion through the guiding slot into the receiving space;
- an end of the resisting portion away from the rotating portion is provided with a resisting block; and
- the resisting block extends through the holding slot and resists against the plate portion of the blade.

* * * * *